US012749518B2

(12) United States Patent
Ayyapureddi

(10) Patent No.: US 12,749,518 B2
(45) Date of Patent: Sep. 29, 2026

(54) SEMICONDUCTOR DEVICES WITH WRAP-AROUND ARRAYS

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

(*) Notice: Subject to any disclaimer, the term of this patent is extended or adjusted under 35 U.S.C. 154(b) by 140 days.

(21) Appl. No.: 18/916,640

(22) Filed: Oct. 15, 2024

(65) Prior Publication Data

US 2025/0166682 A1 May 22, 2025

Related U.S. Application Data

(60) Provisional application No. 63/600,558, filed on Nov. 17, 2023.

(51) Int. Cl.
*G11C 8/00* (2006.01)
*G11C 5/02* (2006.01)
*G11C 8/12* (2006.01)

(52) U.S. Cl.
CPC ................ *G11C 8/12* (2013.01); *G11C 5/025* (2013.01)

(58) Field of Classification Search
CPC .. G11C 8/12; G11C 5/025; G11C 7/08; G11C 7/1006; G11C 11/4091; G11C 8/14; G11C 11/4087; G11C 11/4096
USPC .................................................... 365/230.03
See application file for complete search history.

(56) References Cited

U.S. PATENT DOCUMENTS

| | | | | | |
|---|---|---|---|---|---|
| 4,677,575 | A | * | 6/1987 | Redin | G09G 5/42 345/441 |
| 4,807,191 | A | * | 2/1989 | Flannagan | G11C 29/808 365/230.03 |
| 5,293,348 | A | * | 3/1994 | Abe | G11C 29/808 365/230.03 |
| 5,446,692 | A | * | 8/1995 | Haraguchi | G11C 29/808 365/230.03 |
| 6,751,121 | B2 | | 6/2004 | Marotta | |
| 2008/0112251 | A1 | | 5/2008 | Youn et al. | |
| 2019/0214066 | A1 | | 7/2019 | Nakaoka | |
| 2022/0230668 | A1 | | 7/2022 | Villa | |
| 2023/0206994 | A1 | | 6/2023 | Shang et al. | |

OTHER PUBLICATIONS

International Application No. PCT/US2024/051645—International Search Report and Written Opinion, mailed Feb. 5, 2025, 9 pages.

* cited by examiner

*Primary Examiner* — Tha-O H Bui
(74) *Attorney, Agent, or Firm* — Dorsey & Whitney LLP

(57) ABSTRACT

A semiconductor device is presented. The semiconductor device includes a first memory mat associated with a first memory array segment and a first portion of a second memory array segment, a second memory mat disposed adjacent to the first memory mat, the second memory mat associated with a second portion of the second memory array segment and a first portion of a third memory array segment, and a third memory mat disposed adjacent to the second memory mat and on an opposite side to the first memory mat in the semiconductor device, the third memory mat associated with a second portion of the third memory array segment and a fourth memory array segment.

20 Claims, 8 Drawing Sheets

SEMICONDUCTOR DEVICES WITH WRAP-AROUND ARRAYS

CROSS-REFERENCE TO RELATED APPLICATION(S)

The present application claims priority to U.S. Provisional Patent Application No. 63/600,558, filed Nov. 17, 2023, the disclosure of which is incorporated herein by reference in its entirety.

TECHNICAL FIELD

The present disclosure generally relates to semiconductor memory devices, and more particularly relates to forming wrap-around arrays in dynamic random-access memory (DRAM) semiconductor devices.

BACKGROUND

An apparatus (e.g., a processor, a memory system, and/or other electronic apparatus) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data.

Figure 1:
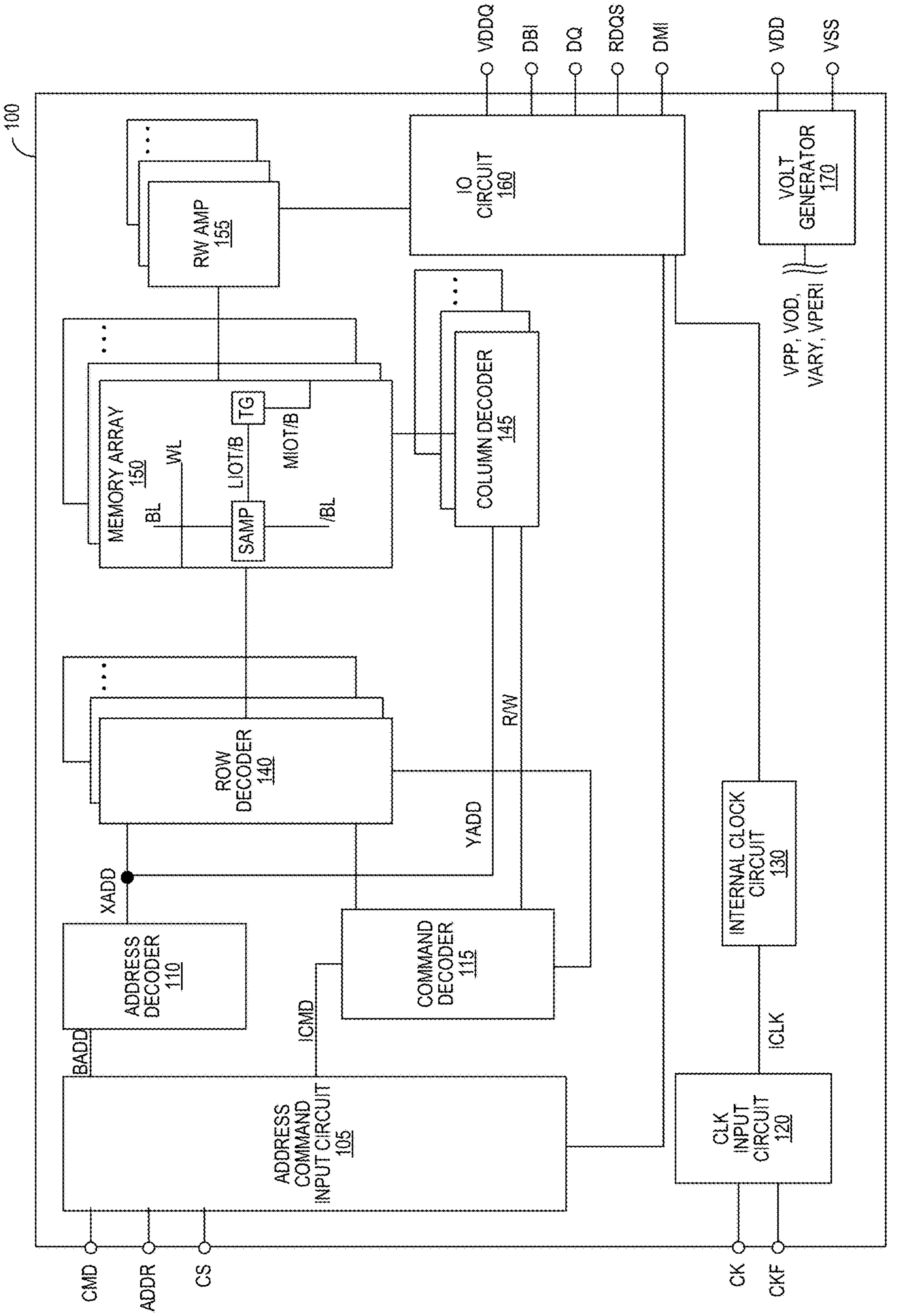
FIG. 1 is a block diagram schematically illustrating a memory device, in accordance with embodiments of the present technology.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION

A semiconductor memory device typically consists of an array of memory cells that are arranged in rows and columns, each one of the memory cells being configured to store a single bit of data. Word lines and bit lines are used across the memory array, connecting each row and each column of the memory cells. For example, the word lines can be disposed horizontally across the memory array and configured to select a particular row of memory arrays for data read or writing operation. Each word line is connected to a corresponding memory section. The bit lines (also referred to as digit lines) can be disposed vertically down the memory array to read or write the data stored in corresponding memory cells. As memory technology has advanced, the size of memory cells has shrunk to increase the density of the memory array. This has led to shrinking of word line and bit lines as well, which has allowed larger or higher capacity memory arrays to be packed in a same amount of space. Even though advanced photolithography techniques have been developed to overcome reticle field constraints to pack more memory cells into a smaller area, it is hard to overcome certain form factor constraints in one direction on memory devices. For example, due to the asymmetrical nature of word line and bit line shrink, standard memory array sizes may exceed dimensions constraints in memory devices. That is, conventionally-arranged memory arrays of a particular capacity may fit within an allowed size in one dimension, but exceed an allowed size in another dimension. In addition, semiconductor manufacturers have been raising the number of memory cells along the bit line direction to increase memory device storage, which has led to manufacturing complexity. The shrinking of memory cells along one direction can also cause memory device electrical performance degradation because the resistance and capacitance of memory cell may change with the size of the memory cell.

To address the above-described challenges and others, the present technology discloses semiconductor memory devices with wrap-around memory arrays. As described herein, the semiconductor memory devices with wrap-around arrays better utilize space available in certain dimensions (e.g., in the horizontal plane) to achieve a high storage volume within allowable constraints (e.g., in the vertical plane). In the disclosed wrap-around memory array architecture, a memory array is formed from one or more memory mats, where each memory mat includes memory cells arranged in rows/columns and its own word lines and bit lines. In addition, each one of the memory mats is coupled with a dedicated address decoder configured for data read and write operations. The memory array may be formed from multiple (e.g., two or more) memory mats aligned horizontally along the word line direction. Further, the wrap-around memory array may include one or more memory array segments. As described below, each segment represents a logical portion of the memory array. In contrast, each mat represents a physical portion of the memory array. Further, each segment may be physically distributed across multiple memory mats, and each memory mat may be associated with (e.g., contain the data for) multiple segments. Further, the number of memory mats and segments forming the array need not to be (but may be) the same. For example, a first memory mat may be associated with a first segment and a second segment, a second memory mat may be associated with the second segment and a third segment, and a third memory mat may be associated with a third segment and a fourth segment, etc. Furthermore, different segments may be associated with each other, such that when performing operations involving one segment, the operation are also be performed on another segment (e.g., a read from or write to one segment also causes a read from or write to the associated segment). The associated segments may be disposed in different memory mats to prevent data contention. For example, a memory device operation may involve a segment (e.g., the second segment) in the first memory mat as well as an associated segment (e.g., the fourth segment) in the third memory mat. During the memory device operation, word lines of corresponding memory sections disposed in the paired memory array segments can be activated for data read or write operations. Further, the word lines activated for paired segments, contained in different mats, may not be in the same vertical plane (e.g., sections associated different rows may be activated). In this wrap-around memory array architecture, the number of memory cells included in each memory mat can be similar or less than that of traditional memory device design in order to control the manufacturing cost and maintain memory device electrical performances. Moreover, in the wrap-around memory array architecture, the multiple memory mats aligned along a horizontal direction within the memory device could greatly raise a total number of memory cells, without violating requirements in the vertical direction, therefore achieving an enhanced memory storage volume for the memory device.

FIG. 1 is a block diagram of an apparatus 100 (e.g., a semiconductor die assembly, including a three-dimensional integration (3DI) device or a die-stacked package) in accordance with an embodiment of the present technology. For example, the apparatus 100 can include a DRAM or a portion thereof that includes one or more dies/chips.

The apparatus 100 may include an array of memory cells, such as memory array 150. The memory array 150 may include a plurality of banks (e.g., banks 0-15), and each bank may include a plurality of word lines (WL), a plurality of bit lines (BL), and a plurality of memory cells arranged at intersections of the word-lines and the bit lines. Memory cells can include any one of a number of different memory media types, including capacitive, magneto resistive, ferroelectric, phase change, or the like. The selection of a word-line WL may be performed by a row decoder 140, and the selection of a bit line BL may be performed by a column decoder 145. Sense amplifiers (SAMP) may be provided for corresponding bit lines BL and connected to at least one respective local input/output (IO) line pair (LIOT/B), which may in turn be coupled to at least a respective one main IO line pair (MIOT/B), via transfer gates (TG), which can function as switches. The sense amplifiers and transfer gates may be operated based on control signals from decoder circuitry, which may include the command decoder 115, the row decoders 140, the column decoders 145, any control circuitry of the memory array 150, or any combination thereof. The memory array 150 may also include plate lines and corresponding circuitry for managing their operation. Furthermore, the memory array 150 may be a wrap-around memory array, configured according to the wrap-around memory array architecture, introduced in the present technology and described herein. For example, the memory array 150 and/or banks of the memory array can include two or more memory mats formed along the word line direction of the memory array 150. The apparatus 100 can further include multiple decoders (e.g., row decoders 140 and/or column decoders 145), where each decoder is associated with and decodes for a location for a memory mat of the memory array 150. The different memory mat-associated decoders enable a single operation (e.g., a host request to read data from a memory address) to access different memory mats, and further different sections and/or rows within those memory mats. As described herein, the memory array 150 implemented as a wrap-around memory array enables a high storage volume through utilizing available space in the horizontal plane of a memory die in which the memory array 150 is assembled.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, and power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller and/or a chipset. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded, and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word-line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register. The write latency WL information can be defined in terms of clock cycles of the CK clock signal. For example, the write latency information WL can be a number of clock cycles of the CK signal after the write command is received by the apparatus 100 when the associated write data is received.

As described herein, read data requested by a read command, and write data supplied with a write command, may be read from or written two multiple memory mats forming the memory array 150 and/or memory banks. For example, the row address and/or column address supplied with the read or write command may be associated with two or more paired memory array segments, and the two or more paired memory array segments may be disposed in two of more memory mats. The row address and/or column address may be decoded by decoders (e.g., row decoders 140, column decoders 145, and/or memory mat-associated decoders that are not shown) to determine the two or more memory mats, and additionally the section and/or row within each mat, where data should be read from or written do. As described herein, the paired memory array segments are disposed over different memory mats to avoid contention accessing the mats.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like, based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VSS in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as timing signals for determining output timing of read data and/or input timing of write data. The IO clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator (not shown in FIG. 1) and thus various internal clock signals can be generated.

The apparatus 100 can be connected to any one of a number of electronic devices capable of utilizing memory for the temporary or persistent storage of information, or a component thereof. For example, a host device of apparatus 100 may be a computing device, such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100; although in other embodiments, the host device may be indirectly connected to a memory device (e.g., over a networked connection or through intermediary devices).

Figure 2:
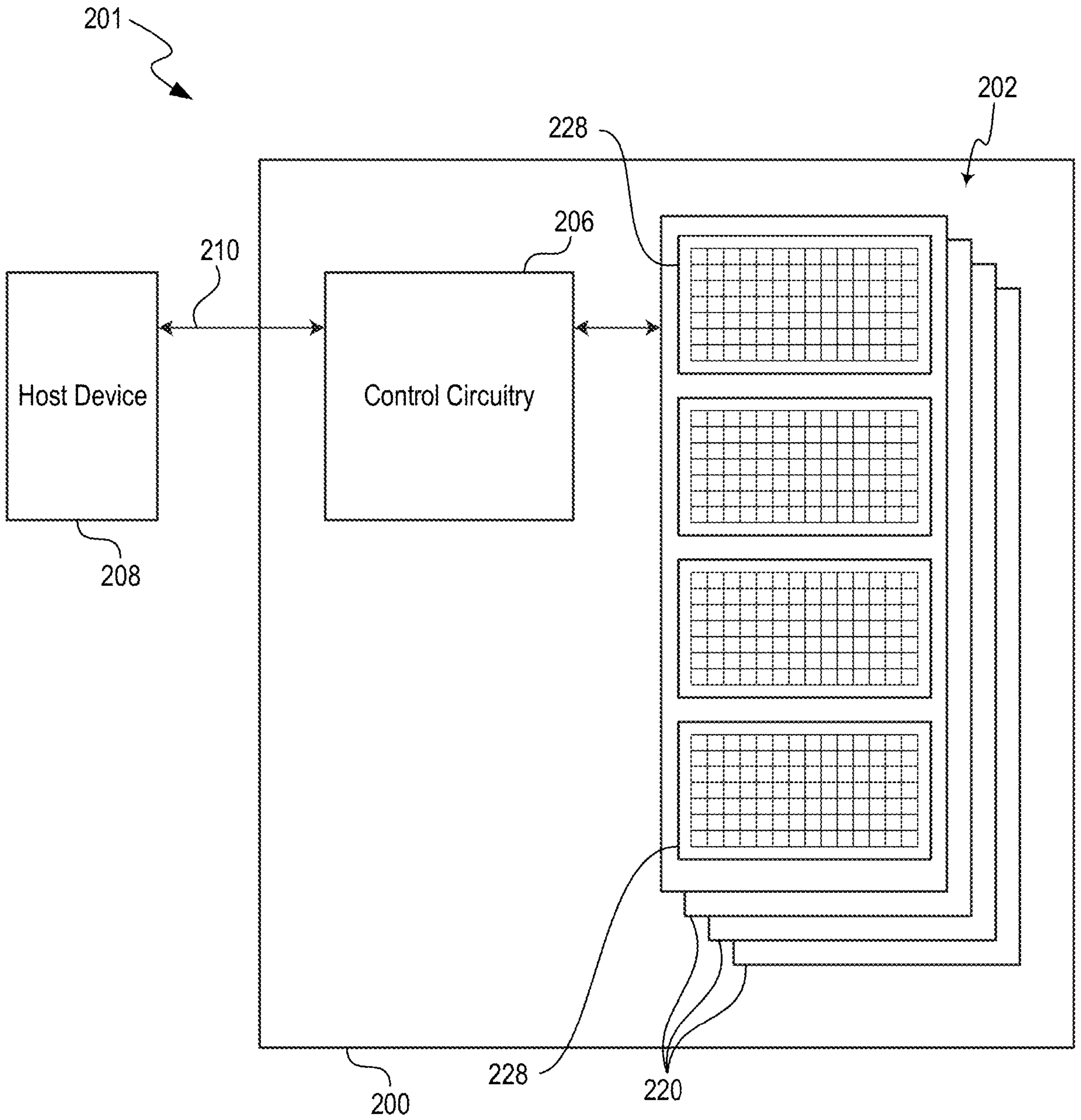
FIG. 2 is a block diagram of a system having a memory device configured in accordance with embodiments of the present technology.

FIG. 2 is a block diagram of a system 201 having a memory device 200 configured in accordance with embodiments of the present technology. The memory device 200 may be an example of or include aspects of the memory device described with reference to FIG. 1. As shown, the memory device 200 includes a main memory 202 (e.g., DRAM, NAND flash, NOR flash, FeRAM, phase change memory (PCM), etc.) and control circuitry 206 operably coupled to a host device 208 (e.g., an upstream central processor (CPU), a memory controller). The control circuitry 206 may include aspects of various components described with reference to FIG. 1. For example, the control circuitry 206 may include aspects of the command/address input circuit 105, the address decoder 110, and the command decoder 115, among others.

The main memory 202 includes a plurality of memory units 220, which each include a plurality of memory cells. The memory units 220 can be individual memory dies, memory planes in a single memory die, a mat of memory dies vertically connected with through-silicon vias (TSVs), or the like. For example, in one embodiment, each of the memory units 220 can be formed from a semiconductor die and arranged with other memory unit dies in a single device package. In other embodiments, multiple memory units 220 can be co-located on a single die and/or distributed across multiple device packages. The memory units 220 may, in some embodiments, also be sub-divided into memory regions 228 (e.g., banks, ranks, channels, blocks, pages, etc.). The memory units 220 may include the wrap-around memory array architecture introduced in the present technology. For example, the memory units 220 may include more than two memory mats that are horizontally aligned along a word line direction to achieve a higher storage volume in the memory device 200.

The memory cells can include, for example, floating gate, charge trap, phase change, capacitive, ferroelectric, magneto resistive, and/or other suitable storage elements configured to store data persistently or semi-persistently. The main memory 202 and/or the individual memory units 220 can also include other circuit components, such as multiplexers, decoders, buffers, read/write drivers, address registers, data out/data in registers, etc., for accessing and/or programming (e.g., writing) the memory cells and other function, such as for processing information and/or communicating with the control circuitry 206 or the host device 208. Although shown in the illustrated embodiments with a certain number of memory cells, rows, columns, regions, and memory units for purposes of illustration, the number of memory cells, rows, columns, regions, and memory units can vary, and can, in other embodiments, be larger or smaller in scale than shown in the illustrated examples. For example, in some embodiments, the memory device 200 can include only one memory unit 220. Alternatively, the memory device 200 can include two, three, four, eight, ten, or more (e.g., 16, 32, 64, or more) memory units 220. Although the memory units 220 are shown in FIG. 2 as including four memory regions 228 each, in other embodiments, each memory unit 220 can include one, two, three, eight, or more (e.g., 16, 32, 64, 100, 128, 256, or more) memory regions.

In one embodiment, the control circuitry 206 can be provided on the same die as the main memory 202 (e.g., including command/address/clock input circuitry, decoders, voltage and timing generators, IO circuitry, etc.). In another embodiment, the control circuitry 206 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 206 can include a processor configured to execute instructions stored in memory to perform various processes, logic flows, and routines for controlling operation of the memory device 200, including managing the main memory 202 and handling communications between the memory device 200 and the host device 208. In some embodiments, the control circuitry 206 can include embedded memory with memory registers for storing (e.g., memory addresses, row counters, bank counters, memory pointers, fetched data, etc.) In another embodiment of the present technology, a memory device 200 may not include control circuitry, and may instead rely upon external control (e.g., provided by the host device 208, or by a processor or controller separate from the memory device 200).

The host device 208 can be any one of a number of electronic devices capable of utilizing memory for the temporary or persistent storage of information, or a component thereof. For example, the host device 208 may be a computing device, such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 208 may be a networking device (e.g., a switch, a router, etc.) or a recorder of digital images, audio and/or video, a vehicle, an appliance, a toy, or any one of a number of other products. In one embodiment, the host device 208 may be connected directly to memory device 200, although in other embodiments, the host device 208 may be indirectly connected to memory device 200 (e.g., over a networked connection or through intermediary devices).

In operation, the control circuitry 206 can directly write or otherwise program (e.g., erase) the various memory regions of the main memory 202. The control circuitry 206 communicates with the host device 208 over a host device bus or interface 210. In some embodiments, the host device 208 and the control circuitry 206 can communicate over a dedicated memory bus (e.g., a DRAM bus). In other embodiments, the host device 208 and the control circuitry 206 can communicate over a serial interface, such as a serial attached SCSI (SAS), a serial AT attachment (SATA) interface, a peripheral component interconnect express (PCIe), or other suitable interface (e.g., a parallel interface). The host device 208 can send various requests (in the form of, e.g., a packet or stream of packets) to the control circuitry 206. A request can include a command to read, write, erase, return information, and/or to perform a particular operation (e.g., a refresh operation, a TRIM operation, a precharge operation, an activate operation, a wear-leveling operation, a garbage collection operation, etc.).

Figure 3B:
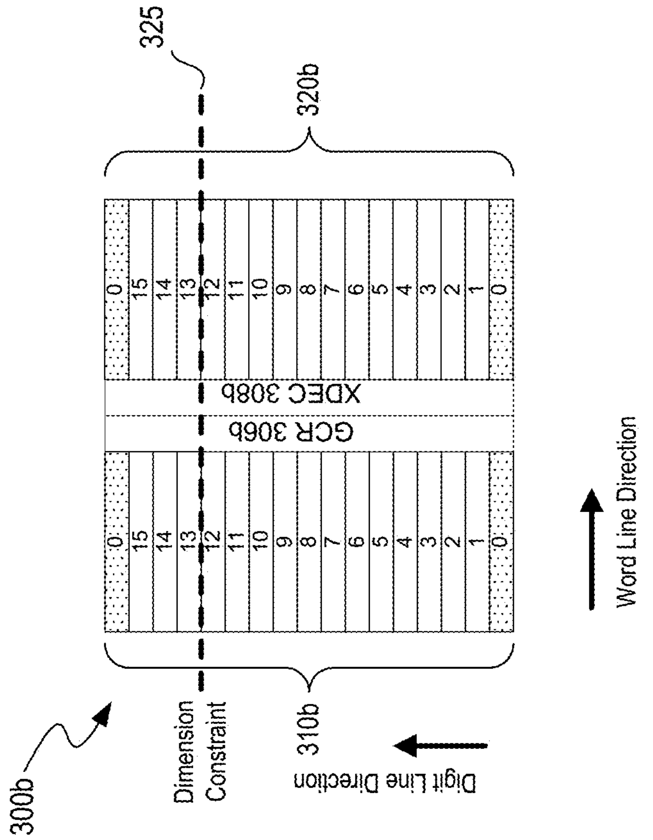
FIG. 3B depicts a schematic view of another memory device including symmetrically arranged two memory arrays.
Figure 3A:
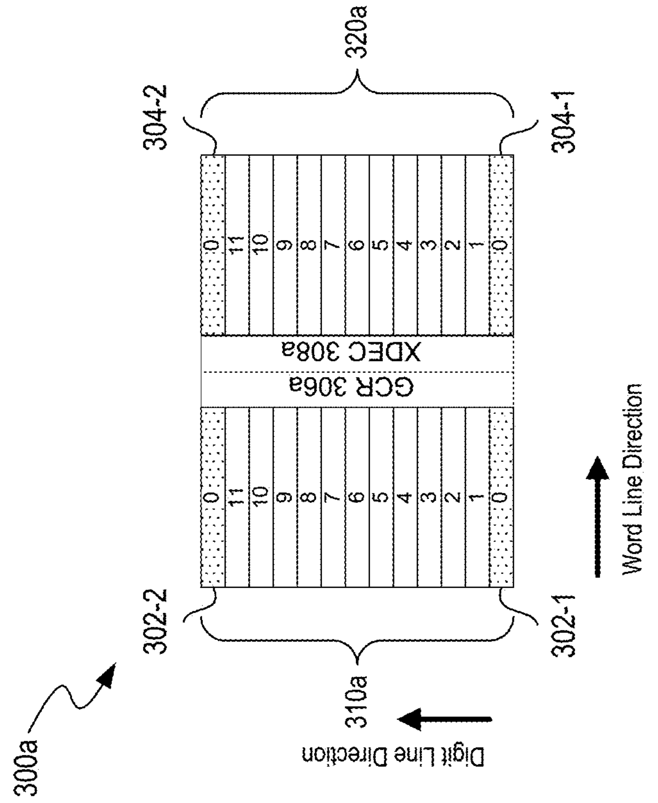
FIG. 3A depicts a schematic view of a memory device including symmetrically arranged two memory arrays.

To further increase storage volume, memory arrays may grow by adding additional sections (e.g., rows). Typically the additional sections grow the memory array in the vertical (e.g., digit line) direction. FIGS. 3A and 3B illustrate conventional memory arrays (e.g., memory arrays that do not implement the wrap-around architecture described herein). Specifically, FIG. 3A illustrates a schematic view of a memory array 300*a*, and FIG. 3B illustrates a schematic view of a memory array 300*b*. As described herein, the memory array 300*a* of FIG. 3A may have a first capacity (e.g., 24 Gb), and an arrangement that fits within a dimensional constraint. The memory array 300*b* of FIG. 3B may have a larger capacity (e.g., 32 Gb) and grows based on a conventional (e.g., not wrap-around) arrangement. For example, the memory array 300*b* may include more sections than the memory array 300*a*, grow along a short line direction (e.g., along the digit line). As described below, the growth of memory array 300*b* along the digit line direction causes it to violate a dimensional constraint.

As shown, the memory array 300*a* may include two memory mats 310*a* and 320*a* that are aligned on a left side and a right side of the memory array 300*a*. Additionally, the memory array 300*a* can include a global column redundancy (GCR) 306*a* and a row address decoder (XDEC) 308*a* that are shared by the memory mats 310*a* and 320*a*. In this example, the memory mat 310*a* and memory mat 320*a* can be co-located (e.g., on a single die) to improve storage density and/or capacity of the memory array 300*a*. As shown, each one of the memory mats 310*a* and 320*a* may include a number of memory sections that are aligned along a digit line (bit line) direction. As shown, each of the memory mat 310*a* and memory mat 320*a* may include 13 memory sections. However, as described further below, some memory sections (e.g., on the edge of the memory mat 310*a* and memory mat 310*b*) may provide less (e.g., half of the) storage provided by other sections. For example, in the embodiment illustrated in FIG. 3A in which memory mat 310*a* includes 2 edge sections (e.g., edge memory sections 302-1 and 302-2) and 11 non-edge sections, the 13 total sections may provide the capacity of 12 non-edge sections. Two edge sections may collectively be referred to as a single section (e.g., two edge sections may be referred to as section 0), even though they may be disposed at different location within a memory mat.

In the memory array 300*a*, multiple memory sections (e.g., the memory sections 0 to 11 included in the memory mats 310*a* and 320*a*) can be vertically arranged along the digit line direction using advanced semiconductor fabrication and packaging techniques to achieve a high storage density. Each one of the memory sections may be identical to each other and include a set of memory planes which contain multiple rows and columns of memory cells. Depending on the designed size of the memory device, each of the memory sections may include one or more memory planes. For example, each one of the memory sections included in memory mats 310*a* and 320*a* may include eight memory planes. These memory planes can be organized in a two-dimensional arrangement, with each memory plane interconnected.

In the example memory arrays 300*a* and 300*b*, sense amplifiers can be disposed at the boundaries between the memory sections. Each memory section connects to sense amplifiers disposed above and/or below to output data. For example, non-edge sections (e.g., sections 1-11 in the embodiment illustrated in FIG. 3A) may be coupled to sense amplifiers disposed above and below each section, and utilize both above and below sense amplifiers to output data (where half the data is read using one set of sense amplifiers and the other half of data is read using the other set of sense amplifiers). In addition, edge sections included in the memory mats 310*a* and 320*a* may only be coupled to sense amplifiers above or below the edge sections, depending on their placement in the memory mats (e.g., where the edge section shares a boundary with another section). In embodiments, edge sections provide half the storage of non-edge sections, because only half of the memory cells of the edge sections are coupled to sense amplifiers. For example, edge section 302-1 is disposed at the bottom of the memory mat 310*a*, and therefore only bound by sense amplifiers along its top boundary through which it can drive data. Therefore, the memory cells of edge memory section 302-1 coupled to the top sense amplifiers provide storage, while the other memory cells (which would be coupled to bottom sense amplifiers if they were so placed) may be unused. Similarly, the edge memory section 302-2 has half the capacity of non-edge sections, since only half of its memory cells can couple to sense amplifiers along its bottom boundary. As shown in FIG. 3A, the edge memory sections 302-1 and 304-1 are respectively disposed at the bottom of memory mats 310*a* and 320*a*, and the edge memory sections 302-2 and 304-2 are respectively disposed at the top of memory mats 310*a* and 320*a*. Moreover, each one of the edge memory sections 302-1, 302-2, 304-1, and 304-2 may have a size half to other non-edge memory sections included in the memory array 300*a*.

In memory devices, the sense amplifier can be utilized to amplify small data signal stored in the memory call and convert it into a stronger signal which can be used by other parts of the memory device or system. When a particular row or column of memory cells are selected for data reading or writing, the corresponding sense amplifiers included in the edge memory sections can be activated to amplify the signals from selected memory cells. In some other examples, the sense amplifiers may be also configured for refreshing the charge in the capacitor periodically to prevent data loss due to charge leakage.

The yield of memory array 300*a* may be improved by replacing malfunctional memory columns in the memory array with one or more redundant memory columns included in the GCR 306. The GCR 306*a* can be disposed in between the memory mats 310*a* and 320*a* to provide extra columns for data storage. The memory columns included in GCR 306*a* can be connected to sense amplifiers of memory sections of memory mats 310*a* and 320*a* via spare column access lines disposed therein. A memory controller (e.g., the memory control circuitry 206 described in FIG. 2) can be connected with the spare column access lines of the GCR 306*a* to control the data input/output in the redundant memory columns. When a malfunctioning column is detected in the memory mat 310*a* or 320*a* during testing or operation, the GCR 306*a* activates and reroutes the data I/O lines to corresponding redundant columns included therein. The malfunctioning column is then bypassed, and the data can be read or written to the redundant column of the GCR 306. This memory architecture and configuration improves memory device yield and enable the memory array 300*a* to operate normally despite the presence of a malfunctional memory column.

In this example, the row address decoder 308*a* can be configurated to select a specific row of memory cells in the memory array 300*a*. Particularly, the row address decoder 308*a* may receive a row address and then activate the corresponding section of memory cells disposed in the symmetrically aligned memory mats 310*a* and 320*a* (e.g., the same vertically-aligned sections are activated in both memory mats, such as activating section 5 in memory mat 310*a* and section 5 in memory mat 310*b*). When a memory location is addressed, the column address can be provided to the command decoder (e.g., the command decoder 115 described in FIG. 1), which activates the row address decoder 308*a* to select appropriate row of memory cells in the memory sections of both of the memory mats 310*a* and 320*a*.

In the symmetrically aligned memory mats 310*a* and 320*a* of the memory array 300*a*, memory sections of memory mat 310*a* can be paired with memory sections of memory mat 320*a*, respectively. For example, memory sections having same ranking numbers in the memory mats 310*a* and 320*a* may share one or more word lines to activate the transistor included in each memory cells of the memory sections for data read and/or write operations. In this example, each word line of the memory array 300*a* may be arranged in rows, connecting memory cells of the paired memory sections in the memory mats 310*a* and 320*a*. During a memory read operation, a specific word line may be activated (e.g., firing a pair of memory sections such as sections 6 in both memory mats 310*a* and 320*a*) to turn on transistors included in the pair of memory sections (e.g., memory cells included in sections 6 in both memory mats 310*a* and 320*a*), causing the transistors to turn on and connect corresponding capacitors to the bit line. Similarly, during a memory write operation, a specific word line can be activated (e.g., firing a pair of memory sections such as sections 4 of the memory mats 310*a* and 320*a*) to apply a voltage that corresponds to the data needed to be written. As illustrated in FIG. 3A, in conventionally-arranged memory arrays, such as memory array 300*a*, memory sections of the same rank (that are used together in operations) may be in the same plane as each other (e.g., at the same position in the vertical dimension).

In conventionally-arranged memory arrays (e.g., memory arrays that do not implement the wrap-around architecture described herein), memory capacity may be increased by adding additional memory sections to the memory array. For example, FIG. 3B depicts a schematic view of a memory array 300*b* including symmetrically aligned memory mats, each one of the memory mats including more memory sections than that of the memory array 300*a*. For example, memory array 300*b* may depict a memory array with a capacity of 32 Gb (in contrast to the example capacity of 24 Gb depicted in memory array 300*a* of FIG. 3A). Specifically, each of the memory mats 310*b* and 320*b* included in the memory array 300*b* can have 16 memory sections (e.g., 15 non-edge sections, and 2 edge sections) that are vertically aligned along the digit line (bit line) direction. In accordance with the number of memory sections included in the memory mats 310*b* and 320*b*, the GCR 306*b* and row address decoder 308*b* can be adjusted. For example, the GCR 306*b* can be fabricated to include redundancy columns having a same number of memory cells to the memory mats 310*b* and 320*b* along the digit line direction.

There are challenges, however, with increasing memory capacity using conventional architectures depicted in FIGS. 3A and 3B. For example, manufacturing challenges and complexity of circuitry can arise with increasing the number of memory sections in each memory mat. Further, as illustrated in FIG. 3B, adding additional sections to memory mats (e.g., increasing memory mats 310*b* and 320*b* to 17 memory sections each) can result in memory mats that violate a constraint (e.g., dimensional constraint 325). In addition, increasing the number of memory sections in a memory chip, e.g., a DRAM chip, can lead to issues with heat dissipation. As the number of memory sections increases, the amount of heat generated by operating the memory device increases, which may cause reliability issues and reduce the lifetime of the memory device. Moreover, increasing the number of memory section in memory device can lead to signal integrity issues and compatibility issues with external memory controllers. Therefore, and as described herein, the present technology is directed to wrap-around arrays that address these and other shortcomings.

Figure 4:
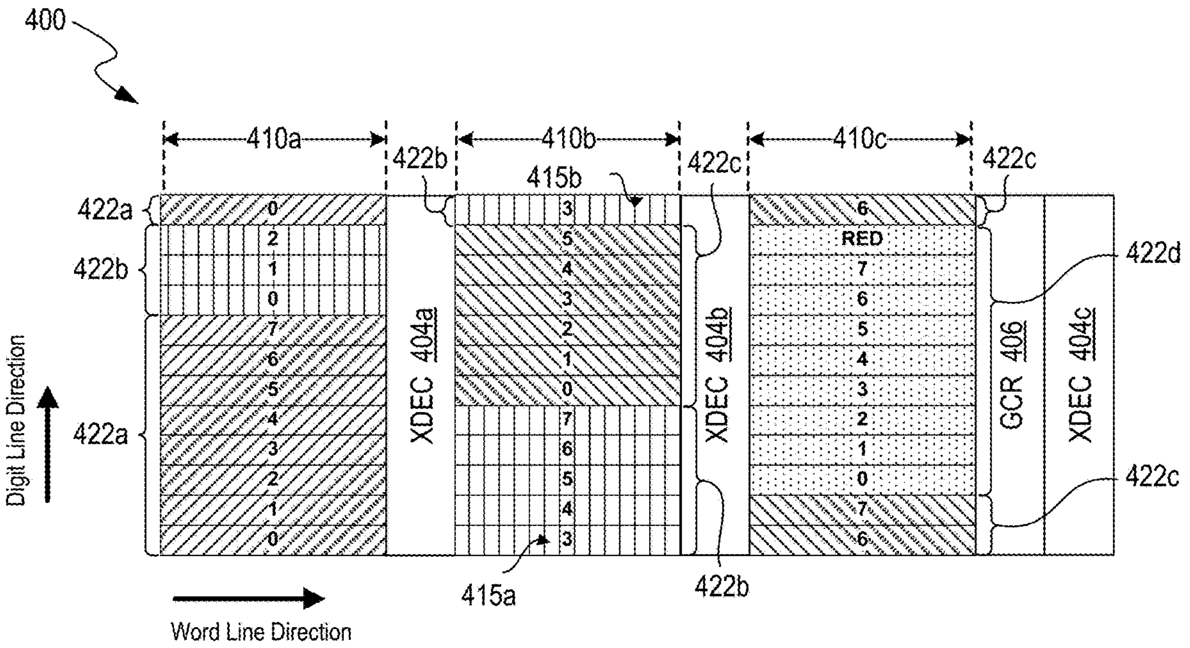
FIG. 4 depicts a schematic view of a memory device having wrap-around memory arrays, in accordance with embodiments of the present technology.

Accordingly, FIG. 4 depicts a schematic view of a memory array 400 having a wrap-around memory array architecture, in accordance with embodiments of the present technology. As described herein, the memory array 400 can be formed from multiple memory mats, which can be wrapped around and aligned in parallel along the labeled word line direction. Further, each memory mat may have a same first number of memory sections that are vertically aligned along a digit line direction orthogonal to the word line direction. As shown in FIG. 4, the memory array 400 can include three memory mats disposed from left to right in the drawing along the word line extending direction, e.g., a first memory mat 410*a* disposed on the left side of the memory array 400, a second memory mat 410*b* disposed in the middle of the memory array 400, and a third memory mat 410*c* disposed on the right side of the memory array 400. In some embodiments the memory array 400 can include other numbers of memory mats. Each one of the memory mats 410*a*, 410*b*, and 410*c* can include a same first number of memory sections. For example, as depicted in FIG. 4, each memory mat includes 12 memory sections (including 2 edge memory sections and 10 non-edge memory sections). As described herein, each memory mat may have a top edge memory section and a bottom edge memory section, each of which provides a half storage size in comparison to the other (e.g., non-edge or inner) memory sections included in corresponding memory mat. For example, memory edge sections 415*a* and 415*b* are disposed on the very bottom and top of the memory mat 410*b*, respectively. Each one of the memory edge sections 415*a* and 415*b* has a half storage size compared to other non-edge sections of the memory mat 410*b*. Thus, as depicted in FIG. 4, each of the memory mats 410*a*, 410*b*, and 410*c* may have a storage capacity corresponding to 11 non-edge memory sections (e.g., 10+0.5+0.5).

Moreover, the wrap-around memory array of the present disclosure may include a plurality of memory array segments, each one of the memory array segments having a same second number of memory sections. In some embodiments, the second number of memory sections (associated with each memory array segment) may be smaller than the first number of memory sections (associated with each memory mat). That is, in some embodiments, the capacity of a memory array segment (as a function of the number of associated memory sections) is less than the capacity of a memory mat (as a function of the number of associated memory sections). In some embodiments the memory array segments may have more or equal number of memory sections as the memory mats. Furthermore, memory array segments may be allocated across different memory mats, and/or each of the memory mats may include more than one memory array segment. For example, the memory array 400 can include four memory array segments, including a first memory array segment 422*a* (illustrated in FIG. 4 with a pattern of diagonal lines extending from lower-left to upper-right), a second memory array segment 422*b* (illustrated in FIG. 4 with a pattern of vertical lines), a third memory array segment 422*c* (illustrated in FIG. 4 with a pattern of diagonal lines extending from upper-left to lower-right), and a fourth memory array segment 422*d* (illustrated in FIG. 4 with a pattern of dots). In some embodiments, memory array segments may be distributed across different memory mats, as depicted in FIG. 4 where a memory array segment (associated with a particular pattern) may be disposed in two different memory mats. For example, a top portion of the memory mat 410*a* is associated with a first portion of the memory array segment 422*b* (e.g., memory sections 0, 1, and 2 of memory array segment 422*b*). Moreover, the bottom portion and top edge of the memory mat 410*b* is associated with a second portion of the memory array segment 422*b* (e.g., memory sections 3, 4, 5, 6, and 7 of memory array segment 422*b*). As illustrated in FIG. 4, both of the portions of the memory array segment 422*b* are illustrated in the same pattern for clarification. In the embodiment illustrated in FIG. 4, each one of the memory array segments may include 8 memory sections (e.g., sections #0 to #7) that are vertically stacked along the digit line direction. Additionally, according to the total number of memory array segments included in the memory array and number of memory sections included in each one of the memory array segments, the memory device may include redundant memory sections (e.g., the memory section labeled as "RED" in the third memory mat 410*c*).

In this example, each one of the memory mats of the memory array 400 may include more than one memory array segments. For example, the first memory mat 410*a* on the left may include the first memory array segment 422*a* and a portion of the second memory array segment 422*b*. The second memory mat 410*b* in the middle may include a portion of the second memory array segment 422*b* and a portion of the memory array segment 422*c*. The third memory mat 410*c* on the right may include a portion of the third memory array segment 422*c* and the fourth memory array segment 422*d*. In other embodiments, not illustrated in FIG. 3A or FIG. 3B, the memory array 400 may include a different number of memory mats, and/or a different number of memory array segments, and/or a different allocation of memory array segments (a portion or their entirety) to memory mats.

In this example, each of the memory mats may include a top edge memory section and a bottom edge memory section for data operations. As described above, edge sections may have less usable capacity, as compared to non-edge sections, because they couple to fewer sense amplifiers. For example, the first memory mat 410*a* may include a top edge memory section and a bottom edge memory section, both having half storage size in comparison to other non-edge memory sections, and marked as memory section 0 of the first memory array segment 422*a*. Similarly, the second memory mat 410*b* may include a top edge memory section and a bottom edge memory section, both having half storage size to other non-edge memory sections, and marked as memory section 3 of the second memory array segment 422*b*. The third memory mat 410*c* may include a top memory section and a bottom edge memory section, both having half storage size to other non-edge memory sections, and marked as memory section 6 of the third memory array segment 422*c*. In the example memory array 400, sense amplifiers can be disposed at the boundaries between the memory sections.

The memory device of the present technology may include row address decoders, each one of the row address decoders being dedicated to one of the multiple memory mats. For example, the memory array 400 may include row address decoder (XDEC) 404*a*, row address decoders 404*b*, and row address decoders 404*c* that are coupled with the first memory mat 410*a*, the second memory mat 410*b*, and the third memory mat 410*c*, respectively. Similar to the row decoders 140 described in FIG. 1, each of the row address decoders 404*a*, 404*b*, and 404*c* can be configured to decode an address (e.g., received as part of a host request to perform a read operation and/or write operation) and to select a memory section from the corresponding memory mat. Each of the row address decoders 404*a*, 404*b*, and 404*c* can be configured to decode a different memory section based on the same received address. That is, for a given address, row address decoder 404*a* may decode a first section of memory mat 410*a*, and row address decoder 404*b* may decode a second section of memory mat 410*b*, etc. In some embodiments, the row address decoders 404*a*, 404*b*, and 404*c* are configured to determine whether any data associated with the received address is located in the corresponding memory mat. In some embodiments, another decoder (not shown) may determine which memory mats are associated with the requested address. As described herein, a decoder (e.g., one of the row address decoders or an alternative decoder not shown) determines that the corresponding memory mat has data associated with the requested address, the memory mat and/or associated circuitry are activated to enable performing the operation on that memory mat (e.g., additional sense amplifiers may be activated). As described herein, a received address may be associated with multiple memory mats. In some embodiments a received address may be associated with data located in multiple, but not all, of the memory mats of the memory array 400. The row address decoders 404*a*, 404*b*, and 404*c* can be fabricated on the same die with the memory array 400. Specifically, each one of the row address decoders 404*a*, 404*b*, and 404*c* may be fabricated adjacent to corresponding memory mats in the memory array 400. In some other examples, the row address decoders can be assembled separately to the memory mats. For example, like the row decoder 140, the row address decoders 404*a*, 404*b*, and 404*c* may be formed in a device that is separated from and coupled to the memory array 400.

The memory device of the present technology may also include one or more global column redundancies (GCRs). For example, the memory array 400 shown in FIG. 4 may include a GCR 406 that is coupled to the memory mats. Here, the GCR 406 may include one or more redundant memory columns having a same number of memory sections to any one of the memory mats of memory array 400. During the operation, any malfunctioning memory columns of the memory mats can be replaced by redundant memory columns included in the GCR 406 so as to improve the yield of memory array 400.

In the present technology, the memory array segments included in memory array 400 may be paired and/or associated with other memory array segments when performing data read and/or data write operations. That is, and as described further herein, when reading data from or writing data to a section associated with one memory array segment, the same operation may be performed on another section associated with a paired memory array segment. For example, in response to a read request from a host, some of the data may be read from a section in one memory array segment, and the remainder of the data read from a section in the paired memory array segment. Similarly, write data from a host may be portioned and written to a section of two paired memory array segments. Furthermore, the sections of the paired memory array segments may be physically disposed in different memory mats of the memory device. In some embodiments, the memory array 400 is configured so that no two paired memory array segments are disposed in the same memory mat. That is, in some embodiments, a memory array segment and its pair are always in different memory mats. In some embodiments, the same section (identified by a section number) of two paired memory array segments may be utilized for an operation, but the sections may be disposed at different physical locations in the vertical dimension of the corresponding memory mats. For example, when activating a word line of a memory section having a specific section number in one memory array segment disposed in a first memory mat, the word line of a memory section having the same section number in the paired memory array segment disposed in a second memory mat may also be activated. In the foregoing example, the first word line and second word line may be disposed at different locations in the vertical dimension. As described herein, same-numbered sections of the paired memory array segments may be disposed in different memory mats of the memory device to prevent data contention, e.g., data signal read/write through sense amplifiers of a same memory mat, thereby facilitating performing operations on the paired segments in parallel.

For example, FIG. 4 illustrates an example embodiment of the present technology in which the first memory array segment 422*a* and the third memory array segment 422*c* can be paired. In addition, the second memory array segment 422*b* and the fourth memory array segment 422*d* can be paired. That is, in the embodiment of the memory array 400 illustrated in FIG. 4, the paired memory array segments are disposed in different memory mats. For example, in the above described first segment memory array pair, the first memory array segment 422*a* can be disposed in the first memory mat 410*a* on the left, and portions of the third memory array segment 422*c* can be disposed in the second memory mat 410*b* in the middle and the third memory mat 410*c* on the right. Moreover, in the above described second memory array segment pair, portions of the second memory array segment 422*b* can be disposed in the first memory mat 410*a* on the left and the second memory mat 410*b* in the middle, and the fourth memory array segment 422*d* can be disposed in the third memory mat 410*c* on the right.

The following are examples of utilizing memory sections disposed in paired memory array segment (which may also be disposed in different memory mats) to satisfy a read operation and/or write operation requested by a host. The following are merely examples illustrating the embodiment of the memory array 400 depicted in FIG. 4. The wrap-around memory architecture disclosed herein encompasses other configurations of memory arrays, comprised of different numbers of memory mats, memory array segments, and/or memory sections. Further, the present technology additionally encompasses other configurations of paired memory array segments disposed across different memory mats, and different arrangements of memory sections within the memory array segments.

In one example, when activating word line of one memory section of the first memory array segment 422*a*, the word line of a corresponding (e.g., the same-numbered) memory section of the third memory array segment 422*c* can be activated as well (e.g., the first memory array segment and third memory array segment are paired). For example, when a data read or write operation identifies, through the row address decoder 404*a* decoding an address associated with the operation, that a portion of the data is be read from or written to the memory section #6 of the memory array segment 422*a*, the memory section #6 of the third memory array segment 422*c* will be identified as well, through the row address decoder 404*c* decoding the address associated with the operation, as responsible for another portion of the data to be read or written. The word lines of memory section #6 of the first memory array segment 422*a* and the word lines of memory section #6 of the third memory array segment 422*c* will be activated simultaneously for the data read or write operations. Here, a portion of the data can be output from or input into the memory section #6 of the first memory array segment 422*a* through the first memory mat 410*a* on the left (i.e., through sense amplifiers included in the top and bottom boundary of memory section #6 of the first memory array segment 422*a*). Moreover, another portion of the data can also be output from or input into the edge memory sections #6 of the third memory array segment 422*c* through the third memory mat 410*c* on the right (e.g., through sense amplifiers disposed along the bottom boundary of the top edge section and disposed along the top boundary of the bottom edge section). In this example, the data input and/or output on the first pair of memory array segments 422*a* and 422*c* can be allocated in different memory mats to prevent delays in data transfer and performance reduction caused by the data contention. That is, and as described herein, portions of the data are able to be read from or written to the two different memory mats at the same time, therefore in parallel performing the partial operations of the memory operation.

In another example, when a data read or write operation identifies, through the row address decoder 404*c*, an address relating to the memory section #4 of the fourth memory array segment 422*d*, the memory section #4 of the second memory array segment 422*b* will be identified as well through the row address decoder 404*b*. The word lines of memory section #4 of the fourth memory array segment 422*d* and the word lines of memory section #4 of the second memory array segment 422*b* can be activated simultaneously for the memory device operations. Similar to the first paired memory array segments, data contention can be avoided in the second pair of memory array segments by allocating data input/output in different memory mats. Here, a portion of the data can be output from or input into the memory section #4 of the fourth memory array segment 422*d* through the third memory mat 410*c* on the right (i.e., through edge amplifiers disposed at the top and bottom edge memory sections #6 of the third memory array segment 422*c*). Moreover, another portion of the data can also be output from or input into the memory section #4 of the second memory array segment 422*b* through the second memory mat in the middle (i.e., through sense amplifiers disposed along the bottom boundary of the top edge section 415*b* and disposed along the top boundary of the bottom edge section 415*a*).

In the present technology, memory sections associated with different memory array segments, and disposed in at least two memory mats, can be accessed together for data read and/or write operations. As described above, in the memory array 400, a memory data read/write operation may access a pair of memory array segments that are disposed in two different memory mats. For example, the first pair of memory array segments 422*a* and 422*c* can be accessed simultaneously through the first memory mat 410*a* on the left and the second memory mat 410*b* in the middle (e.g., for row addresses relating to memory sections #0-#5 of corresponding memory array segments). The first pair of memory array segments 422*a* and 422*c* can also be accessed simultaneously through the first memory mat 410*a* on the left and the third memory mat 410*c* on the right (e.g., for row addresses relating to memory sections #6-#7 of corresponding memory array segments). In another example, the second pair of memory array segments 422*b* and 422*d* can be accessed simultaneously through the third memory mat 410*c* on the right and the second memory mat 410*b* in the middle (e.g., for row addresses relating to memory sections #3-#7 of corresponding memory array segments). The second pair of memory array segments 422*b* and 422*d*422*d* can also be accessed simultaneously through the third memory mat 410*c* on the right and the first memory mat 410*a* on the left (e.g., for row addresses relating to memory sections #0-#2 of corresponding memory array segments). In other words, although the memory array 400 may be configured such that certain memory array segments are paired (e.g., memory array segments 422*a* and 422*c*, and memory array segments 422*b* and 422*d*422*d*, the memory mats used to perform operations involving the paired memory array segments (e.g., the memory mats from which read data is provided or to which write data is written to) may change depending on which memory sections of the memory array segments are being accessed.

The above are illustrative examples of the operation of the row address decoders 404*a*, 404*b*, and 404*c* based on a particular distribution of numbered sections in memory array segments that are distributed across different memory mats. It will be appreciated that the row address decoders 404*a*, 404*b*, and 404*c* be implemented differently, and resolve input addresses to different word lines (corresponding to different section numbers) for different arrangements. For example, row address decoders 404*a*, 404*b*, and 404*c* can be implemented differently depending on how the memory array segments are disposed among the different memory mats. That is, in the example of FIG. 4, row address decoder 404*a* can be configured according to the first memory array segment 422*a* and second memory array segment 422*b* being disposed in the first memory mat 410*a*, but in other embodiments other memory array segments may be disposed in the first memory mat 410*a*. Similarly, in the example illustrated in FIG. 4 the row address decoder 404*a* is configured according to sections numbered 0-2 of the second memory array segment 422*b* being disposed in the depicted physical locations of the first memory mat 410*a*, but in other embodiments other numbered sections of the second memory array segment 422*b* may be disposed in the first memory mat 410*a* and/or the sections numbers 0-2 of the second memory array segment may be disposed in other physical locations of the first memory mat.

Figure 5:
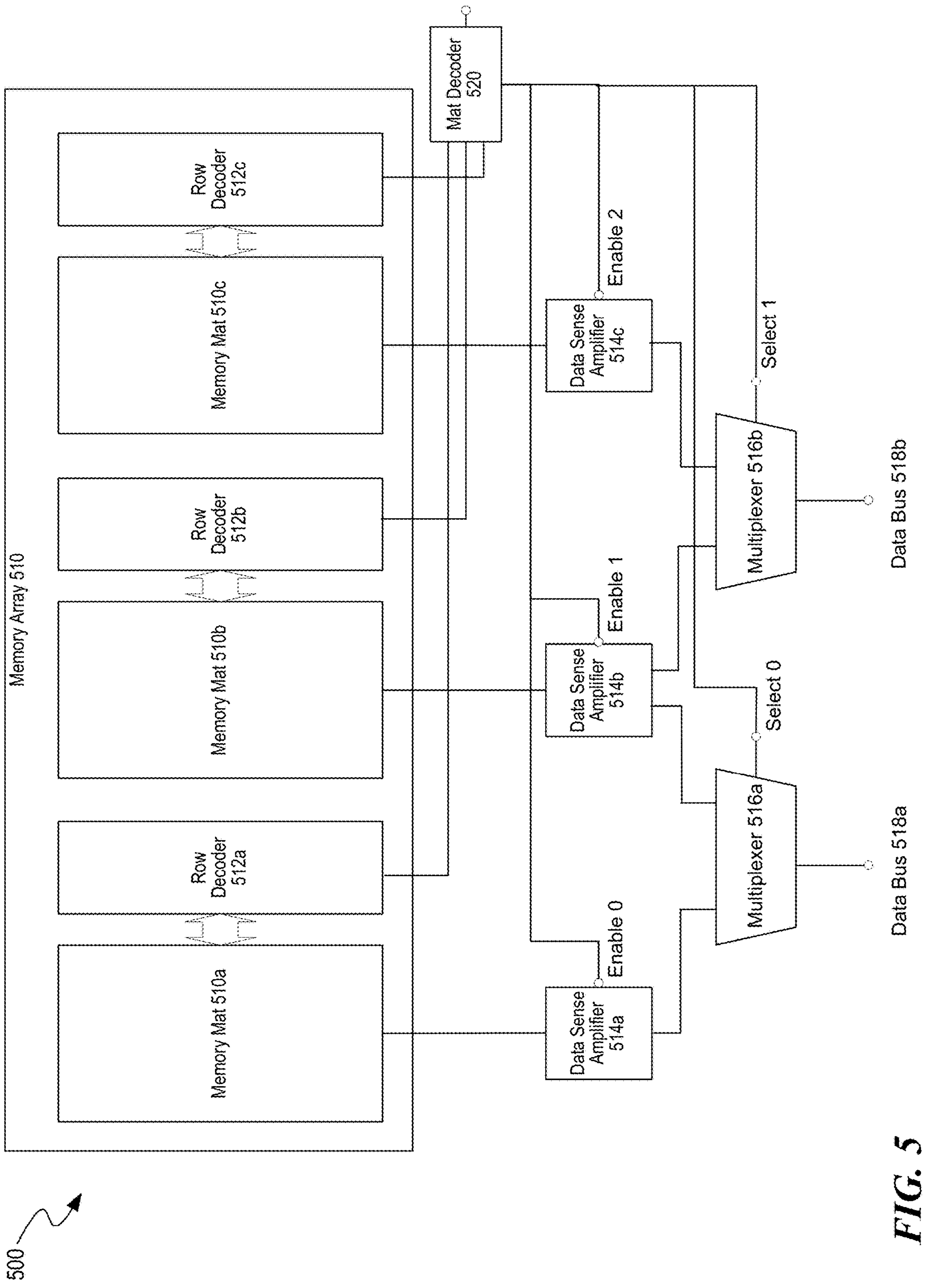
FIG. 5 is a block diagram schematically illustrating a memory system, in accordance with embodiments of the present technology.

FIG. 5 is a block diagram schematically illustrating a memory system 500 in accordance with embodiments of the present technology. The memory system 500 may include a memory array 510 and peripheral circuits that assist memory data read and/or write operations on the memory array 510. Specifically, the memory array 510 may have device architecture and/or configurations similar to the memory array 400 described in FIG. 4 (e.g., a wrap-around memory array architecture). For example, the memory array 510 may include a plurality of memory mats (e.g., memory mats 510*a*, 510*b*, and 510*c*) that are aligned along a word line extending direction. In this example, the memory mats 510*a*, 510*b*, and 510*c* can be horizontally aligned and adjacent to each other in the memory array 510.

The memory array 510 may also include a plurality of row address decoders that are coupled to the plurality of memory mats. For example, row address decoders 512*a*, 512*b*, and 512*c* can be disposed on a same die with the memory mats and electrically connected to the memory mats 510*a*, 510*b*, and 510*c*, respectively. In some other examples, the plurality of row address decoders can be assembled separately from the memory array 510, e.g., being included in an electrical device electrically connected to the memory array 510. Each one of the plurality of row address decoders can be configured to receive control signals or commands, and decode row address of memory locations that need to be accessed in the corresponding memory mat. In addition, the memory array 510 may include one or more redundancy columns (not shown) that are coupled to the memory mats and configured to replace malfunctioning memory columns included in the memory array 510.

In embodiments of the disclosed technology, each one of the memory mats 510*a*, 510*b*, and 510*c* can include one or more memory array segments, and each memory array segment may include a same number of memory sections that are stacked along a bit line extending direction. For example, the memory array 510 may include a group of four memory array segments, similar to that of the memory array 400, respectively in its memory mats 510*a*, 510*b*, and 510*c*. The memory array segments included in the memory array 510 can be paired and disposed in different memory mats, to ensure that data read and/or write operations can go through different memory mats to prevent data contention.

As shown in FIG. 5, the memory system 500 also include peripheral circuits used in combination with the memory array 510 to read from and/or write data to the memory array 510 (e.g., used for input/output). For example, the memory system 500 may include a mat decoder 520. As described herein, the mat decoder 520 decodes an address (e.g., received as part of a host request) and determines which memory mats will be accessed to perform the corresponding memory operations. For example, the mat decoder 520 can enable data sense amplifiers used to read data from the memory mats, and control data path logic (e.g., multiplexors and/or de-multiplexors) used to read data from and/or write data to the memory mats. As described herein, the mat decoder 520 can enable the access to multiple memory mats in parallel. As described above, the row address decoders 512*a*, 512*b*, and 512*c* further determine the physical rows to be accessed within the accessed memory mats (e.g., by also decoding the address, or portion of, received from the host). In some embodiments the mat decoder 520 is part of an address decoder (e.g., the address decoder 110 of FIG. 1) and/or command decoder (e.g., the command decoder 115 of FIG. 1).

In some embodiments the mat decoder 520 decodes additional information based on a received address, instead of or in addition to an indication of the memory mats to be accessed. For example, the mat decoder 520 may determine in which memory array segments a received address is in. Further, the mat decoder 520 may determine the section number, within the determined memory array segments, associated with the received address. Each of the row address decoders 512*a*, 512*b*, 512*c* may receive that information from the mat decoder 520 (e.g., the memory array segments and memory section), based on which they decode the physical location within the corresponding memory mat that is associated with either of the memory array segments and memory section.

The peripheral circuits included in the memory system 500 may also include a plurality of data sense amplifier. For example, data sense amplifiers 514*a*, 514*b*, and 514*c* can be respectively coupled to the memory mats 510*a*, 510*b*, and 510*c*, as shown in FIG. 5. In this example, each one of the data sense amplifiers can be electrically connected to corresponding memory mat to read data stored in the memory cells of the corresponding memory mat. Here, each one of the data sense amplifiers can be configured to amplify small signal levels received from corresponding memory mat to a higher voltage level so that the output data signal can be interpreted by memory control. In addition, each one of the data sense amplifiers can be connected to memory cells through a bit line array included in the corresponding memory mat. The data sense amplifiers can be configured to compare voltage level differences on complementary bit lines and then amplify the voltage difference to a higher voltage level, which can be then transmitted back to the memory controller. Moreover, each one of the data sense amplifiers 514*a*, 514*b*, and 514*c* may be selectively enabled or disabled through applying control signals to their enable input pins. In some embodiments, the data sense amplifiers 514*a*, 514*b*, and 514*c* may be selectively enabled depending on which memory mats are being accessed for a given operation. For example, the mat decoder 520 may generate individual enable signals (labeled as enable 0, enable 1, and enable 2 in FIG. 5), for each of the data sense amplifiers 514*a*, 514*b*, and 514*c*, based on a received address (e.g., from a host as part of a host request).

The peripheral circuits included in the memory system 500 may further include a plurality of multiplexers for data read and/or write operations. For example, a first multiplexer 516*a* and a second multiplexer 516*b* can be included in the memory system 500 as shown in FIG. 5. Here, the inputs of the first multiplexer 516*a* can be coupled to the memory mat 510*a* and memory mat 510*b* through data sense amplifier 514*a* and data sense amplifier 514*b*, respectively. The output of the first multiplexer 516*a* can be coupled to a first data bus 518*a*. Further, the inputs of the second multiplexer 516*b* can be respectively coupled to the memory mat 510*b* and memory mat 510*c* through data sense amplifier 514*b* and data sense amplifier 514*c*, respectively. The output of the second multiplexer 516*b* can be coupled to a second data bus 518*b*. As illustrated in FIG. 5, the multiplexers 516*a* and 516*b* can be configured to select which input (e.g., data from which memory mat) to drive to their output (e.g., the coupled data bus) based on controls (e.g., select 0 and select 1) from the mat decoder 520. In other words, the mat decoder 520 can determine which memory mats will drive the data buses 518*a* and 518*b* of the memory system. The mat decoder can make the determination, for example, in response to a read request from a host based on the memory mats storing the data of read request's address.

In the memory system 500, data transferred through the data bus 518*a* can be read from or written to the memory cells in the memory mats 510*a* and 510*b*. Additionally, data transferred through the data bus 518*b* can be read from or written to the memory cells included in the memory mats 510*b* and 510*c*. As shown in FIG. 5, the outputs multiplexers 516*a* and 516*b* are connected to the data buses 518*a* and 518*b*, respectively. Further, the data buses 518*a* and 518*b* can be connected to the terminal DQ, as shown in FIG. 1. For example, the first data bus 518*a* may provide a first half of data for the terminal DQ (e.g., the most significant bits), and the second data bus 518*b* may provide a second half of data for the terminal DQ (e.g., the least significant bits).

In addition to the multiplexers 516*a* and 516*b* illustrated in FIG. 5, the peripheral circuits included in the memory system 500 may further include a plurality of demultiplexers (not shown). For example, the memory system 500 may include two demultiplexers, where the input of each is coupled to a different data bus (e.g., the input of one demultiplexer coupled to the first data bus 518*a*, and the input of another demultiplexer coupled to the second data bus 518*b*), and the outputs of the demultiplexers are coupled to the memory mats. Similarly, the demultiplexers may be controlled by the mat decoder 520. That is, while the multiplexers may be used to determine which memory mat outputs will drive the data buses of the memory system, the demultiplexers may be used to determine to which memory mats to drive data from the data buses. In some embodiments, and described herein, the multiplexers are used during operations reading from the memory array 510, and the demultiplexers are used during operations writing to the memory array 510.

In a data read operation, the memory system 500 may receive a read command from a host and/or memory controller. The data address can be decoded by the mat decoder 520. As described above, decoded address information (e.g., the data address itself, and/or memory array segment and memory section information from the mat decoder 520) can be further transmitted to the row address decoders 512*a*, 512*b*, and 512*c*. Each one of the row decoders can decode information provided by the mat decoder 520 and select the row of memory cells that are read. In some embodiments, each one of the row address decoders may further determine whether the row address is related to memory array segments included in the memory mat that the row address decoder is coupled to. If the decoded row address matches to memory cells or memory sections of segment memory array included therein, the row address decoder can further activate corresponding word line for voltage signal output.

For example, in one data read operation, a memory read command and address from a host can be sent to the memory system 500. The mat decoder 520 may decode the address and determine that the read data is stored in a memory section #6 of the first memory array segment and the memory section #6 of a third memory array segment of the memory array 510. Here, the first and third memory array segment can be disposed in different memory mats, e.g., the first memory array segment being disposed in memory mat 510*a* and the third memory array segment being disposed in the memory mats 510*b* and 510*c*. In some embodiments, the mat decoder 520 may determine the memory mats in which the identified memory array segments and memory section numbers are disposed.

Once the memory mats are identified during the data read operation, the data sense amplifiers and multiplexers can be enabled correspondingly. For example, once the mat decoder 520 and/or row address decoders identify corresponding memory mats (e.g., the memory mat 510*a* and the memory mat 510*c* for the data read operation), the data sense amplifier 514*a* and data sense amplifier 514*c* will be enabled to process and transmit output data from the memory mat 510*a* and the memory mat 510*c* for the data read operation, respectively. In addition, both of the first multiplexer 516*a* and the second multiplexer 516*b* can be configured to route data signals from the activated data sense amplifiers and out of the memory system 500 (e.g., to DQ).

In some embodiments, some of those row decoders will decode even though the corresponding memory mat doesn't contain that memory sections indicated by the mat decoder 520. In this case, the data sense amplifier coupled to that memory mat (e.g., data sense amplifier 514*b* connected to memory mat 510*b*) will not be enabled, and the multiplexers 516*a* and 516*b* will select data from other memory mats (e.g., the memory mats 510*a* and 510*c*). In other words, the decode performed by certain of the row address decoders 512*a*, 512*b*, and 512*c* may be a don't care when the corresponding memory mat output will not be selected.

In a data write operation, the memory system 500 may receive a data write command, write data, and data address from the memory controller. The input data address can be decoded by the mat decoder 520 and transmitted to the row address decoders 512*a*, 512*b*, and 512*c*. In some embodiments, based on input data address information contained in the data input command (e.g., MSB+1 bit or MSB+2 bit data on data address command), the mat decoder 520 can identify the multiple memory mats to which the write data is to be written (e.g., a portion of the write data in a first memory mat, another portion of the write data in a second memory mat). In some embodiments, each one of the row address decoders identify whether its coupled memory mat matches to the decoded data address information and proceed accordingly. The data sense amplifiers and demultiplexers included in the memory system 500 can also be configured based on the input data address and/or decoded information (e.g., from mat decoder 520 and/or row address decoders 512*a*, 512*b*, and 512*c*).

For example, in one data write operation, a memory write command can be sent to the memory system 500, indicating to write data to memory cells of memory sections #4 of a fourth memory array segment and a second memory array segment. The second and fourth memory array segments are paired in this example for data read and write operations. Further, the memory section #4 of the fourth memory array segment can be disposed in the memory mat 510*c* and the memory section #4 of the second memory array segment can be disposed in the memory mat 510*b*. Here, the data input command may contain the memory mat selection information (e.g., MSB+1 bit or MSB+2 bit of input data address) which can be decoded by the row address decoders 512*a*, 512*b*, and 512*c*. In this example, the row address decoder 512*b* and 512*c* will select memory mat 510*b* and 510*c* for the data write operation and unselect the memory mat 510*a*.

In some embodiments, the mat decoder 520 can be configured to determine, from the received address, two or more memory array segments (e.g., the first memory array segment and the third memory array segment) that the data is stored in, and further the memory section within the segments that the data is stored in. The memory array segment information and memory section information can be then transmitted to corresponding row decoders (e.g., the row address decoder 512*a* corresponding to the first memory array segment, and the row address decoder 512*c* corresponding to the third memory array segment). Based on the transmitted information, the row decoders select memory rows and word lines for the corresponding memory mat. In this example, input date can be transmitted from the multiplexers 516*a* and 516*b* to corresponding memory sections in memory mats 510*a* and 510*c*, respectively.

In some embodiments, some of those row decoders will decode even though the corresponding memory mat doesn't contain that memory sections indicated by the mat decoder 520. In this case, the data sense amplifier coupled to that memory mat (e.g., data sense amplifier 514*b* connected to memory mat 510*b*) will not be enabled, and the multiplexers 516*a* and 516*b* will transmit data to other memory mats (e.g., the memory mats 510*a* and 510*c*).

In the present technology, the mat decoder 520 can be configured to decode, based on received command and address, the pair of memory array segments for the data input/output operations. Further, the mat decoder 520 can determine the memory sections of above noted memory array segments. In accordance with the decoded memory array segments and memory sections information, the mat decoder 520 can further control (e.g., enable or disable) the data sense amplifiers, multiplexers, and demultiplexers connected to the memory array 510. Individual row decoders coupled to each one of the memory mats can decode address transmitted from the mat decoder 520 and fire corresponding word lines for data read or write operations.

Figure 6:
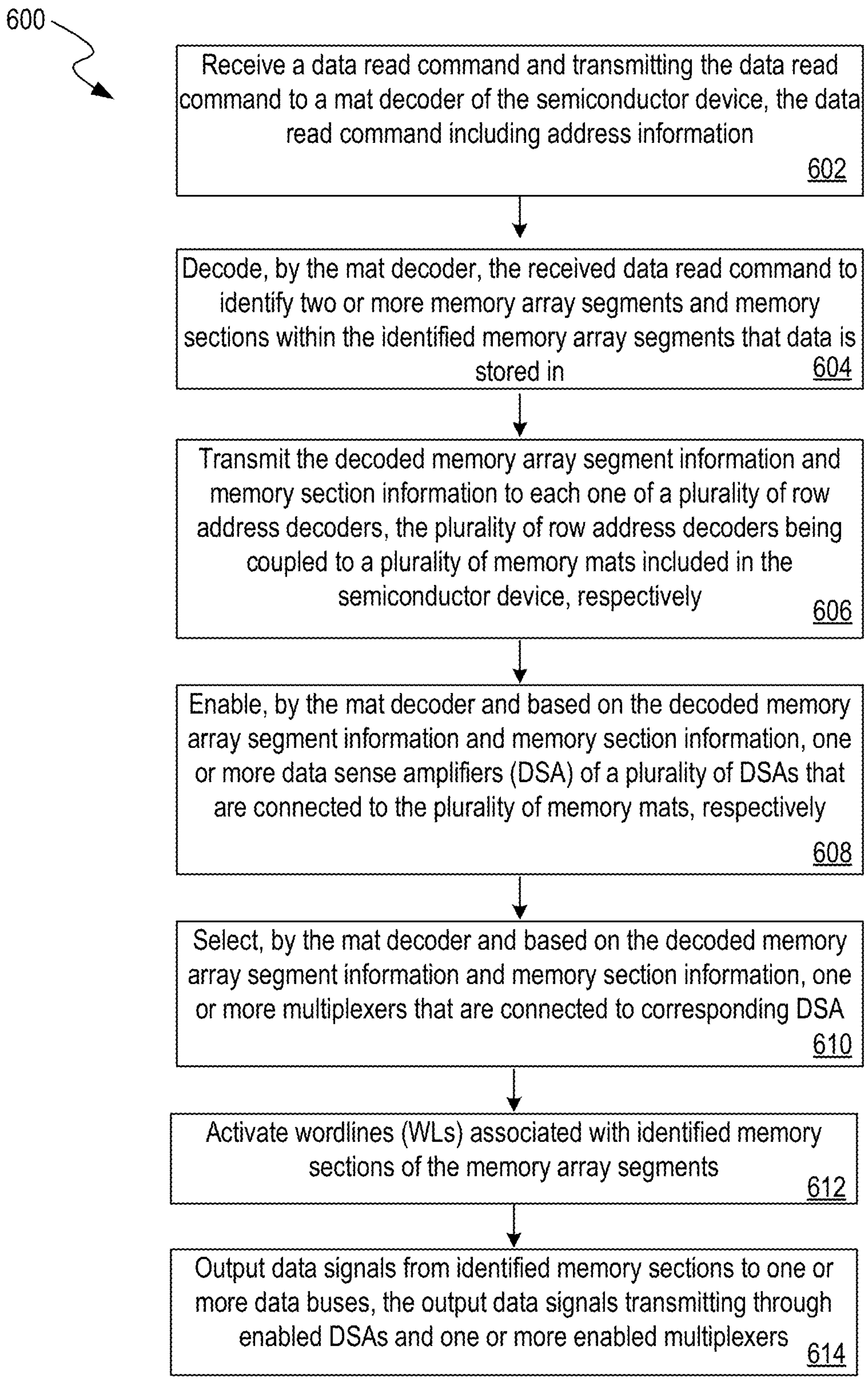
FIG. 6 is a flow diagram illustrating a method for data read operations on a memory device, in accordance with embodiments of the present technology.

FIG. 6 is a flow diagram illustrating a method 600 for data read operation on a memory device with wrap-around arrays (e.g., such as the memory devices and/or memory arrays described in FIGS. 1, 2, 4, and 5), in accordance with embodiments of the present technology. For example, the method 600 may include receiving a data read command and transmitting the data read command to a command/address decoder and/or mat decoder of the semiconductor device, the data read command including address information, at step 602. For example, the memory device may receive a memory read command which includes memory address information. The memory read command can be further transmitted to a mat decoder for processing.

In addition, the method 600 may include decoding, by the mat decoder, the received data read command to identify two or more memory array segments and memory sections within the identified memory array segments that data is stored in, at step 604. For example, once received the memory read command, the mat decoder can decode the command and embedded address information. Moreover, the mat decoder can identify the memory array segments information and memory sections included in the identified memory array segments, based on the received memory read command.

Further, the method 600 may include transmitting the decoded memory array segment information and memory section information to each one of a plurality of row address decoders, the plurality of row address decoders being coupled to a plurality of memory mats included in the semiconductor device, respectively, at step 606. For example, the mat decoder can transmit the decoded memory array segment information and memory sections information to multiple row decoders, each of which is associated with a memory mat.

The method 600 may also include enabling, by the mat decoder and based on the decoded memory array segment information and memory section information, one or more data sense amplifiers (DSA) of a plurality of DSAs that are connected to the plurality of memory mats, respectively, at step 608. For example, based on the decoded memory array segment and memory sections information, the mat decoder can enable one or more of multiple DSAs, each of which is associated with a memory mat, for the memory read operation.

Moreover, the method 600 may include controlling, by the mat decoder and based on the decoded memory array segment information and memory section information, one or more multiplexers that are connected to corresponding DSA, at step 610. For example, based on the decoded memory array segment and memory sections information, the mat can also control each of multiple multiplexers that receive the DSA output as inputs, and that couple to an output bus (e.g., DQ or a portion thereof), for the memory read operation.

The method 600 may also include activating WLs of identified memory sections of the memory array segments, at step 612. For example, WLs connected to the identified memory sections of corresponding memory array segments can be activated.

Lastly, the method 600 may include outputting data signals from identified memory sections to one or more data buses, the output data signals transmitting through enabled DSAs and one or more enabled multiplexers, at step 614. For example, the activated WLs can transfer data stored in identified memory sections out of the memory array. The memory array data output will also go through the enabled DSAs and multiplexers.

Figure 7:
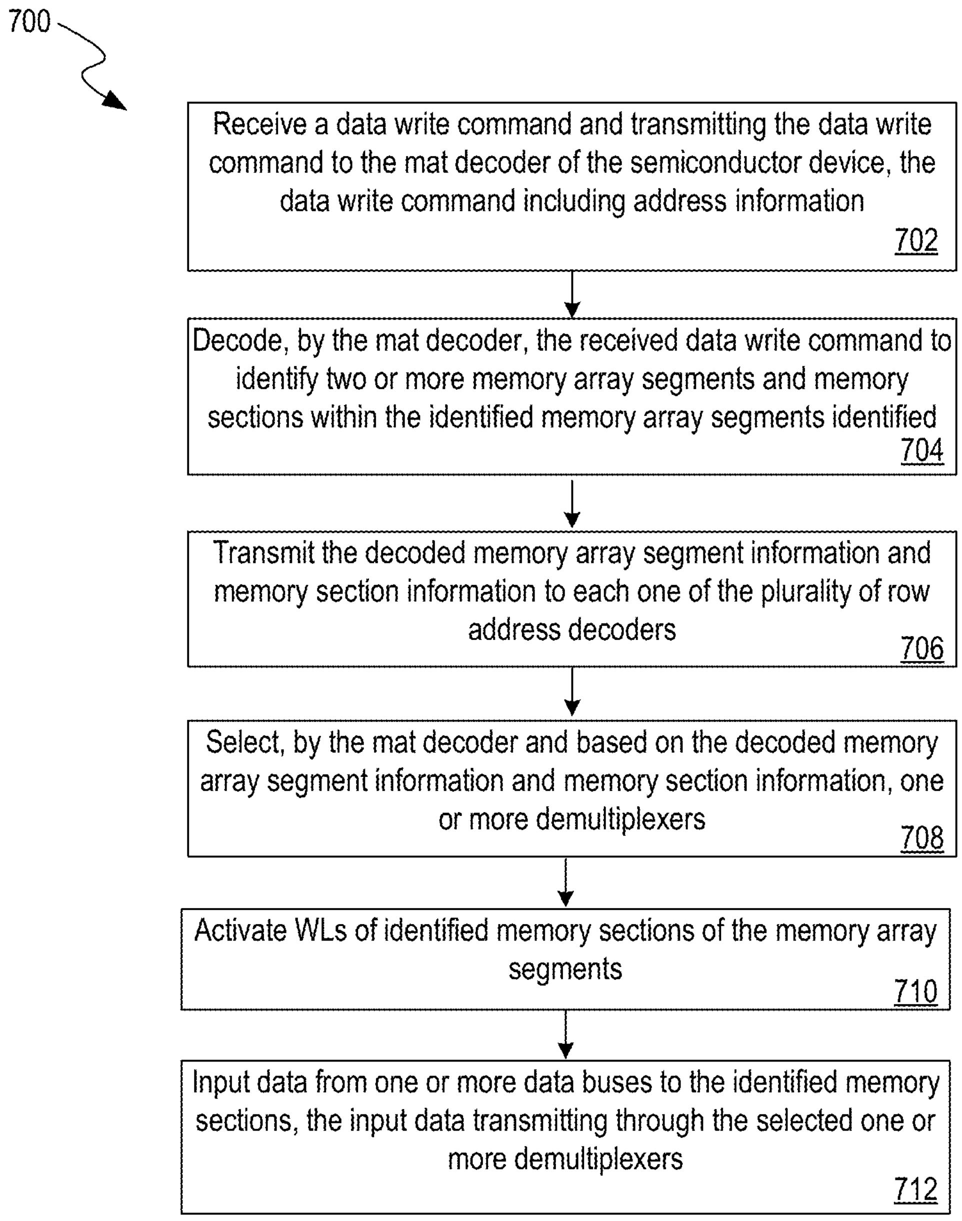
FIG. 7 is a flow diagram illustrating a method for data write operations on a memory device, in accordance with embodiments of the present technology.

FIG. 7 illustrates a flow diagram describing a method 700 for data write operation on a memory device with wrap-around arrays (e.g., such as the memory devices and/or memory arrays described in FIGS. 1, 2, 4, and 5), in accordance with embodiments of the present technology. For example, the method 700 may include receiving a data write command and transmitting the data write command to the command/address decoder and/or mat decoder of the semiconductor device, the data write command including address information, at 702. For example, the memory device may receive a memory write command which includes memory address information. The memory write command can be further transmitted to a mat decoder for processing.

In addition, the method 700 may include decoding, by the mat decoder, the received data write command to identify two or more memory array segments and memory sections within the identified memory array segments identified, at 704. For example, once received the memory write command, the mat decoder can decode the command and embedded address information. Moreover, the mat decoder can identify the memory array segments information and memory sections included in the identified memory array segments, based on the received memory write command.

Further, the method 700 may include transmitting the decoded memory array segment information and memory section information to each one of the plurality of row address decoders, at 706. For example, the mat decoder 520 can transmit the decoded memory array segment information and memory sections information to multiple row decoders, each of which is associated with a memory mat.

The method 700 may also include controlling, by the mat decoder and based on the decoded memory array segment information and memory section information, one or more demultiplexers, at step 708. For example, based on the decoded memory array segment and memory sections information, the mat decoder can also control each of multiple multiplexers that receive write data (e.g., from a DQ or portion thereof) as inputs and that couple to the multiple memory mats, for the memory write operation.

In addition, the method 700 may include activating WLs of identified memory sections of the memory array segments, at step 710. For example, WLs connected to the identified memory sections of corresponding memory array segments can be activated.

Lastly, the method 700 may include inputting data from one or more data buses to the identified memory sections, the input data transmitting through the enabled DSAs and one or more controlled demultiplexers, at step 712. The data input will go through the enabled DSAs and selected MUX.

Figure 8:
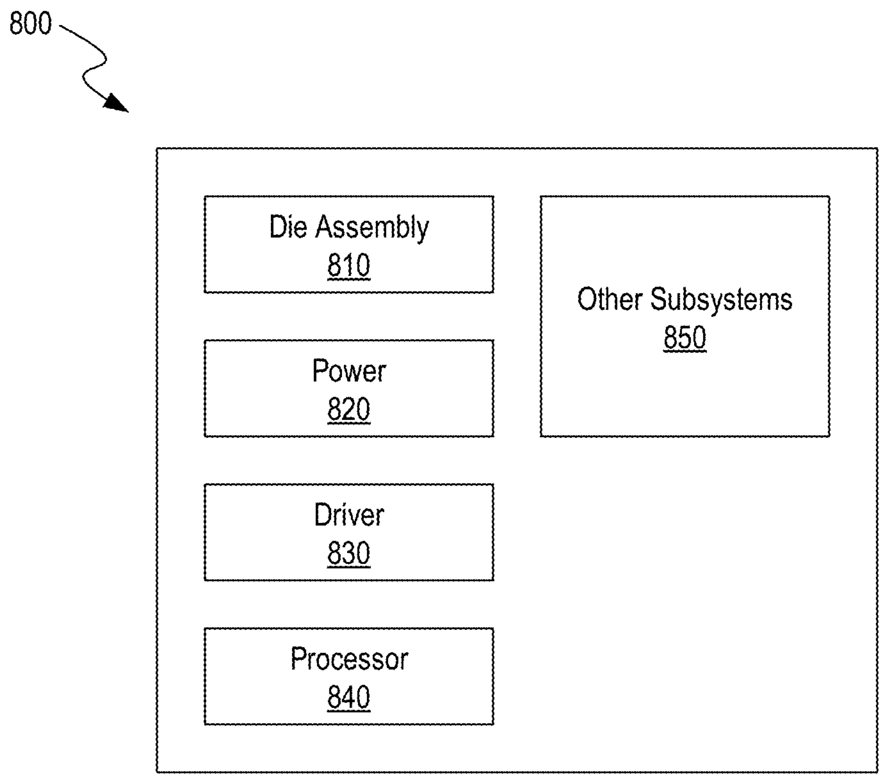
FIG. 8 is a schematic view of a system that includes a semiconductor device configured according to embodiments of the presented technology.

Any one of the semiconductor structures described above with reference to FIGS. 1-7 can be incorporated into any of a myriad of larger and/or more complex systems, a representative example of which is system 800 shown schematically in FIG. 8. The system 800 can include a semiconductor device 810, a power source 820, a driver 830, a processor 840, and/or other subsystems or components 850. The semiconductor device 810 can include features generally similar to those of the semiconductor devices described above and can therefore include wrap-around memory arrays described in the present technology. The resulting system 800 can perform any of a wide variety of functions, such as memory storage, data processing, and/or other suitable functions. Accordingly, representative systems 800 can include, without limitation, hand-held devices (e.g., mobile phones, tablets, digital readers, and digital audio players), computers, and appliances. Components of the system 800 may be housed in a single unit or distributed over multiple, interconnected units (e.g., through a communications network). The components of the system 800 can also include remote devices and any of a wide variety of computer-readable media.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term “substrate” can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In accordance with one aspect of the present disclosure, the semiconductor devices illustrated above could be memory dice, such as dynamic random access memory (DRAM) dice, NOT-AND (NAND) memory dice, NOT-OR (NOR) memory dice, magnetic random access memory (MRAM) dice, phase change memory (PCM) dice, ferroelectric random access memory (FeRAM) dice, static random access memory (SRAM) dice, or the like. In an embodiment in which multiple dice are provided in a single assembly, the semiconductor devices could be memory dice of a same kind (e.g., both NAND, both DRAM, etc.) or memory dice of different kinds (e.g., one DRAM and one NAND, etc.). In accordance with another aspect of the present disclosure, the semiconductor dice of the assemblies illustrated and described above could be logic dice (e.g., controller dice, processor dice, etc.), or a mix of logic and memory dice (e.g., a memory controller die and a memory die controlled thereby).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, “or” as used in a list of items (for example, a list of items prefaced by a phrase such as “at least one of” or “one or more of”) indicates an inclusive list such that, for example, a list of at least one of A, B, or C means A or B or C or AB or AC or BC or ABC (i.e., A and B and C). Also, as used herein, the phrase “based on” shall not be construed as a reference to a closed set of conditions. For example, an exemplary step that is described as “based on condition A” may be based on both a condition A and a condition B without departing from the scope of the present disclosure. In other words, as used herein, the phrase “based on” shall be construed in the same manner as the phrase “based at least in part on.”

As used herein, the terms “top,” “bottom,” “over,” “under,” “above,” and “below” can refer to relative directions or positions of features in the semiconductor devices in view of the orientation shown in the Figures. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device, comprising:

a first memory mat associated with a first memory array segment and a first portion of a second memory array segment;

a second memory mat disposed adjacent to the first memory mat, the second memory mat associated with a second portion of the second memory array segment and a first portion of a third memory array segment; and a third memory mat disposed adjacent to the second memory mat and on an opposite side to the first memory mat in the semiconductor device, the third memory mat associated with a second portion of the third memory array segment and a fourth memory array segment, wherein each one of the first, the second, the third, and the fourth memory array segments comprises a same number of memory sections, wherein the first memory array segment and the third memory array segment are paired so that word lines (WLs) of corresponding memory sections of the first memory array segment and the third memory array segment can be activated simultaneously, and wherein the second memory array segment and the fourth memory array segment are paired so that WLs of corresponding memory sections of the second memory array segment and the fourth memory array segment can be activated simultaneously.

2. The semiconductor device of claim 1, further comprising a first row address decoder coupled to the first memory mat; a second row address decoder coupled to the second memory mat; and a third row address decoder coupled to the third memory mat.

3. The semiconductor device of claim 1, wherein the first memory mat, the second memory mat, and the third memory mat are aligned along a WL extending direction of the semiconductor device, wherein the memory array segments associated with each one of the first memory mat, the second memory mat, and the third memory mat are aligned along a bit line (BL) extending direction of the semiconductor device, the BL extending direction being orthogonal to the WL extending direction, and wherein memory sections included in each one of the first memory mat, the second memory mat, and the third memory mat are aligned along the BL extending direction.

4. The semiconductor device of claim 1, wherein memory sections of the paired first memory array segment and third memory array segment are disposed at different rows of corresponding memory mats, and wherein memory sections of the paired second memory array segment and fourth memory array segment are disposed at different rows of corresponding memory mats.

5. The semiconductor device of claim 1, wherein each one of the first memory mat, the second memory mat, and the third memory mat includes a first edge memory section and a second edge memory section that are disposed on top and bottom of corresponding memory mat, respectively, and wherein the first and second edge memory sections each has a memory storage half of non-edge memory sections included in the semiconductor device.

6. The semiconductor device of claim 5, wherein the first and second edge memory sections of the first memory mat are associated with the first memory array segment, the first and second edge memory sections of the second memory mat are associated with the second memory array segment, and the first and second edge memory sections of the third memory mat are associated with the third memory array segment.

7. The semiconductor device of claim 2, further comprising a first data sense amplifier (DSA) connected to the first memory mat; a second DSA connected to the second memory mat; and a third DSA connected to the third memory mat, wherein each one of the first DSA, the second DSA, and the third DSA is configured to amplify data signal output from corresponding memory mat of the semiconductor device.

8. The semiconductor device of claim 7, further comprising a first multiplexer connected to the first DSA and the second DSA; and a second multiplexer connected to the second DSA and the third DSA.

9. The semiconductor device of claim 8, wherein the first DSA is connected to a first data bus and the second DSA is connected to a second data bus.

10. The semiconductor device of claim 2, further comprising one or more global column redundancies, each one of the one or more global column redundancies including redundant memory cells that are configured to replace malfunctioning memory cells of the semiconductor device.

11. The semiconductor device of claim 8, further comprising a mat decoder connected to the first row address decoder, the second row address decoder, and the third row address decoder, wherein the mat decoder is configured to decode memory mat information and memory section information for data input and output operations.

12. The semiconductor device of claim 11, wherein the mat decoder is configured to identify one or more pairs of memory array segments and memory sections related to a data input or data output address.

13. The semiconductor device of claim 11, wherein the mat decoder is configured to enable or disable each one of the first DSA, the second DSA, and the third DSA.

14. The semiconductor device of claim 13, wherein the mat decoder is configured to control the first multiplexer and the second multiplexer in accordance with the enabling or disabling of each one of the first DSA, the second DSA, and the third DSA.

15. A semiconductor device, comprising:

a plurality of memory mats aligned along a word line (WL) extending direction, each one of the plurality of memory mats including a first number of memory sections aligned along a bit line (BL) extending direction, the BL extending direction being orthogonal to the WL extending direction; and a plurality of memory array segments, each one of the memory array segments is associated with a same second number of memory sections, the second number being smaller than the first number, wherein each of the plurality of memory array segments is associated with one or more of the plurality of memory mats, wherein each one of the plurality of memory mats is associated with at least a portion of a first memory array segment and a portion of a second memory array segment, and wherein WLs of memory sections of the portion of the first memory array segment and the portion of the second memory array segment are activated simultaneously.

16. The semiconductor device of claim 15, further comprising a plurality of data sense amplifiers (DSAs) each connected to a corresponding one of the plurality of memory mats, the plurality of DSAs being configured to amplify data signals output from corresponding memory mats.

17. The semiconductor device of claim 16, further comprising a plurality of multiplexers, each one of the plurality of multiplexers being connected to two or more DSAs of the plurality of DSAs.

18. The semiconductor device of claim 17, further comprising a mat decoder connected to a plurality of row address decoders, each one of the plurality of row address decoders being coupled to corresponding one of the plurality of memory mats, wherein the mat decoder is configured to decode memory mat information and memory section information for data input and output operations.

19. A method of operating a semiconductor device, comprising:

receiving a data read command and transmitting the data read command to a mat decoder of the semiconductor device, the data read command including address information;

decoding, by the mat decoder, the received data read command to identify two or more memory array segments and memory sections within the identified memory array segments that data is stored in;

transmitting the decoded memory array segment information and memory section information to each one of a plurality of row address decoders, the plurality of row address decoders being coupled to a plurality of memory mats included in the semiconductor device, respectively;

enabling, by the mat decoder and based on the decoded memory array segment information and memory section information, one or more data sense amplifiers (DSA) of a plurality of DSAs that are connected to the plurality of memory mats, respectively;

selecting, by the mat decoder and based on the decoded memory array segment information and memory section information, one or more multiplexers that are connected to corresponding DSA, activating word lines (WLs) associated with identified memory sections of the memory array segments;

outputting data signals from identified memory sections to one or more data buses, the output data signals transmitting through enabled DSAs and one or more enabled multiplexers.

20. The method of claim 19, further comprising:

receiving a data write command and transmitting the data write command to the mat decoder of the semiconductor device, the data write command including address information;

decoding, by the mat decoder, the received data write command to identify two or more memory array segments and memory sections within the identified memory array segments identified;

transmitting the decoded memory array segment information and memory section information to each one of the plurality of row address decoders;

selecting, by the mat decoder and based on the decoded memory array segment information and memory section information, one or more demultiplexers, activating WLs of identified memory sections of the memory array segments;

inputting data from one or more data buses to the identified memory sections, the input data transmitting through the selected one or more demultiplexers.

* * * * *